United States Patent [19]

Sawada et al.

[11] Patent Number: 5,742,480
[45] Date of Patent: Apr. 21, 1998

[54] OPTICAL MODULE CIRCUIT BOARD HAVING FLEXIBLE STRUCTURE

[75] Inventors: Sosaku Sawada; Ryoji Sakamoto; Hiromi Kurashima; Daisuke Takagi; Satoshi Ohe; Takeshi Sekiguchi; Nobuo Shiga, all of Yokohama, Japan

[73] Assignee: Sumitomo Electric Industries, Ltd., Osaka, Japan

[21] Appl. No.: 552,351

[22] Filed: Nov. 2, 1995

[30] Foreign Application Priority Data

| Nov. 2, 1994 | [JP] | Japan | 6-269870 |
| Nov. 9, 1994 | [JP] | Japan | 6-275099 |

[51] Int. Cl.⁶ ............................... H05K 1/00; H01R 9/09
[52] U.S. Cl. .................... 361/749; 174/254; 174/255; 385/89; 439/67; 439/77
[58] Field of Search ................ 29/830, 832; 156/306.6; 174/254, 117 F, 259, 117 FF, 255, 113 R, 268; 361/749, 792–795; 385/14, 24, 88, 89, 76, 129, 131, 277.11; 439/67, 77, 493, 79, 80

[56] References Cited

U.S. PATENT DOCUMENTS

| 4,539,476 | 9/1985 | Donuma et al. | 250/227 |
| 4,595,839 | 6/1986 | Braun | 250/551 |
| 4,979,787 | 12/1990 | Lichtenberger | 350/96.2 |
| 5,005,939 | 4/1991 | Arvanitakis et al. | 350/96.2 |
| 5,099,307 | 3/1992 | Go et al. | 357/70 |
| 5,170,453 | 12/1992 | Go et al. | 385/70 |
| 5,249,245 | 9/1993 | Lebby et al. | 385/89 |
| 5,361,318 | 11/1994 | Go et al. | 385/89 |
| 5,373,109 | 12/1994 | Argyrakis et al. | 174/117 FF |
| 5,374,469 | 12/1994 | Hino et al. | 174/254 |
| 5,488,682 | 1/1996 | Sauter et al. | 385/89 |
| 5,513,073 | 4/1996 | Block et al. | 439/67 |
| 5,539,848 | 7/1996 | Galloway | 385/89 |
| 5,572,619 | 11/1996 | Maruo et al. | 385/143 |
| 5,598,501 | 1/1997 | Maruo et al. | 385/143 |
| 5,604,831 | 2/1997 | Dittman et al. | 385/88 |
| 5,625,734 | 4/1997 | Thomas et al. | 385/88 |
| 5,632,630 | 5/1997 | Card et al. | 439/67 |

FOREIGN PATENT DOCUMENTS

| 0 488 894 | 6/1992 | European Pat. Off. |
| 0 535 473 | 4/1993 | European Pat. Off. |
| 0 555 934 | 8/1993 | European Pat. Off. |

*Primary Examiner*—Donald Sparks
*Attorney, Agent, or Firm*—Cushman Darby & Cushman IP Group of Pillsbury Madison & Sutro LLP

[57] ABSTRACT

It is an object of the present invention to provide a highly reliable optical module circuit board having a sufficient mechanical strength with respect to an external stress. An optical module circuit board according to the present invention includes a flexible printed circuit having at least a multilayered structure in which a layer containing a conductive metal interconnection is sandwiched between insulating layers, wherein the flexible printed circuit includes a main body portion having the multilayered structure, a first surface mounted with an electronic component, and a second surface opposite to the first surface, a neck portion having the multilayered structure and extending from one end of the main body portion, and a head portion positioned at a distal end of the neck portion extending from the one end of the main body portion, having the multilayered structure, and mounted with an optical operation element and a bypass capacitor, Particularly, the neck portion defines the positional relationship between the main body portion and the head portion so as to give the circuit board a sufficient mechanical strength.

13 Claims, 14 Drawing Sheets

OPTICAL MODULE CIRCUIT BOARD HAVING FLEXIBLE STRUCTURE

BACKGROUND OF THE INVENTION

1. Field of the Invention

The present invention relates to an optical module circuit board used for an optical communication system such as an optical local area network (LAN) or an optical data link using light as an information transmission medium.

2. Related Background Art

Japanese Patent Laid-Open No. 2-271308 discloses a conventional optical module. This conventional optical module comprises a cylindrical sleeve. The sleeve consists of a metal such as stainless steel. One end of the sleeve has an opening for storing an optical operation element. The other end of the sleeve also has an opening capable of accommodating at least a part of an optical fiber positioning ferrule arranged at the distal end of a connector plug. The optical operation element is fixed in this sleeve with an adhesive or the like. The outer wall of the sleeve has a flange for fixing the sleeve.

The conventional optical module further includes a package body for supporting a circuit board. A support plate for fixing a sleeve is fixed in the package body with an adhesive or the like. The flange of the sleeve which receives the optical operation element is adhered and fixed to the support plate. Terminals extending from the bottom portion of the optical operation element is electrically connected to a constituent element (an electronic component such as a resistor, bare chip IC, etc.) of the circuit board mounted on the package body. An electrical signal output from this electronic circuit is extracted outside the optical module through a plurality of lead pins.

U.S. Pat. No. 4,979,787 discloses another optical module. In this optical module, part of a flexible printed circuit (FPC) of a circuit board on which electronic components are mounted is bent at a right angle, and an optical operation element is directly mounted on this bent portion.

SUMMARY OF THE INVENTION

The inventors discovered the following undesirable structures of the conventional optical module. In an optical module disclosed in Japanese Patent Laid-Open No. 2-271308, the terminal of an optical operation element is formed and connected to a circuit board. In this optical module, the manufacturing process is difficult because the setting position of the optical operation element itself varies owing to a stress applied to the terminal in forming, and the like. Furthermore, the impedance of the terminal is high, so that the structure of this optical module is easily affected by external noise.

When part of the flexible printed circuit is directly bent at a right angle in the above manner a sufficient strength can be obtained with respect to a stress in the bending direction. In the structure of the conventional optical module, however, a sufficient strength cannot be obtained with respect to a stress except for that in the bending direction, e.g., a stress in a direction to twist part (rising portion) of the flexible printed circuit. When a stress is applied in the direction to twist this rising portion, the rising portion may be cut off from the main body portion of the flexible printed circuit.

It is an object of the present invention to provide an optical module circuit board having a sufficient mechanical strength with respect to an external stress while maintaining high reliability.

The optical module circuit board according to the present invention comprises a flexible printed circuit, in which a neck portion for absorbing an unexpected stress is formed, between a main body portion for mounting an electronic component and a head portion for mounting an optical operation element. As in the conventional optical module, if a bypass capacitor for removing noise of a driving power supply for an optical operation element is mounted on the main body portion (flat portion) of a flexible printed circuit, the optical operation element is spaced apart from the bypass capacitor. For this reason, a sufficient bypass effect cannot be obtained even with an arrangement in which the optical operation element is mounted on a rising portion (head portion). To the contrary, in the present invention, a power supply filter circuit including a bypass capacitor is mounted on a head portion for mounting an optical operation element, thereby obtaining a general-purpose optical module circuit board while maintaining high reliability.

More specifically an optical module circuit board according to the present invention comprises a flexible printed circuit having at least a multilayered structure in which a layer containing a conductive metal interconnection is sandwiched between insulating layers (e.g., a structure in which a layer containing a conductive metal interconnection is sandwiched between insulating materials such as polyimide). This flexible printed circuit is constituted by: a main body portion having the multilayered structure, having a first surface mounted with an electronic component, and a second surface opposite to the first surface; a neck portion having the multilayered structure, extending from one end of the main body portion, and having a first surface continuously extending from the first surface of the main body portion, and a second surface continuously extending from the second surface of the main body portion; and a head portion positioned at a distal end of the neck portion extending from the one end of the main body portion, having the multilayered structure, and mounted with an optical operation element and a power supply filter circuit including a bypass capacitor, the head portion having a first surface continuously extending from the first surface of the neck portion, and a second surface continuously extending from the second surface of the neck portion.

The second surface of the head portion is backed with an auxiliary plate to reinforce the head portion, while the second surface of the main body portion is backed with a base plate to reinforce the main body portion. The first and second surfaces of the neck portion are exposed to absorb an unexpected stress, thereby maintaining flexibility.

Particularly, the neck portion holds the head portion so as to set the first surface of the head portion on a plane difference from a plane coplanar with the first surface of the main body portion. A barycenter in a region of the head portion for mounting an optical operation is offset in a direction perpendicular to a direction H of the neck portion extending from the main body portion and a direction D to bend the neck portion. Note that, in this specification, the barycenter of the element mounting region is obtained by drawing a polygon using, as vertices, the centers of through holes which are formed in the head portion and receive the terminals of the optical operation element. That is, the barycenter in the mounting region of the head portion for mounting the optical operation element means the barycenter of the polygon.

Various bases (TO packages) are employed for the optical operation element which is to be mounted on the head portion. Assume that the bottom portion (portion for extracting a lead pin to the outside) of an optical operation element has the projection of a solder used for welding a ground terminal in mounting such an optical operation element on the head portion, if the optical operation element is directly attached to the rising portion of the flexible printed circuit, a load is undesirably applied to the flexible printed circuit itself, as in the conventional optical module. For this reason, it is difficult to mount the optical operation element by an automatic assembly machine. In the optical module circuit board according to the present invention, the auxiliary plate having the first surface adhered to the second surface of the head portion comprises a recess which has a predetermined diameter and is formed in a surface of the second surface opposite to the first surface) facing the optical operation element. The diameter of this recess is larger than that of the through hole extending from the second surface of the auxiliary plate to the first surface of the head portion.

The main body portion of the flexible printed circuit on the optical module circuit board according to the present invention can be replaced with a general printed wiring board, of all the optical module circuit boards of the present invention, on which various electronic components are mounted. That is, this circuit board comprises a flexible printed circuit having at least a multilayered structure in which a layer containing a conductive metal interconnection is sandwiched between insulating layers (e.g., a structure in which a layer containing a conductive metal interconnection is sandwiched between insulating materials such as polyimide), wherein the flexible printed circuit is constituted by: a head portion having the multilayered structure, a power supply filter circuit with a bypass capacitor mounted on a first surface, and an optical operation element mounted on a second surface opposite to the first surface; and a terminal portion having the multilayered structure, extending from one end of the head portion, and having a first surface continuously extending from the first surface of the head portion, and a second surface continuously extending from the second surface of the head portion.

This terminal portion functions as a neck portion for holding the head portion on a plane different from a plane coplanar with the component mounting surface of the printed wiring board, when the terminal portion is electrically connected and fixed to the general printed wiring board. It is preferable that an auxiliary plate having a first surface being in contact with the second surface of the head portion to entirely cover the second surface, and a second surface opposite to the first surface and facing the optical operation element be arranged on the second surface of the head portion. A recess having a predetermined diameter is formed at the opening portion of a through hole, in the second surface of the auxiliary plate, which receives a ground pin of an optical operation element, in correspondence with various optical operation elements. The diameter of this recess is larger than that of the through hole extending from the second surface of the auxiliary plate to the first surface of the head portion.

The optical module circuit board of the present invention comprises the flexible printed circuit having the neck portion for coupling the head portion on which the optical operation element is mounted to the main body portion on which an electronic component is mounted. Therefore, a structure in which the neck portion absorbs an unexpected stress except for that in the bending direction can be realized.

In addition, the auxiliary plate is fixed to the optical operation element mounting surface (second surface) of the head portion. The recess for storing the projection formed on the bottom portion of the optical operation element is formed in the surface of the auxiliary plate facing the optical operation element. With this arrangement, the optical operation element can be firmly mounted on the head portion.

Still further, the power supply filter circuit including the bypass capacitor for removing noise of a driving power supply for the optical operation element is mounted on the head portion together with the optical operation element. With this arrangement, a sufficient bypass effect can be obtained in the optical module circuit board of the present invention. The neck portion coupling the head portion to the main body portion is used as the terminal portion of the head portion on which the optical operation element and the power supply filter circuit are mounted. Therefore, a general-purpose structure capable of being mounted on various main body portions (general printed wiring boards) can be realized.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples; while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

Figure 1:
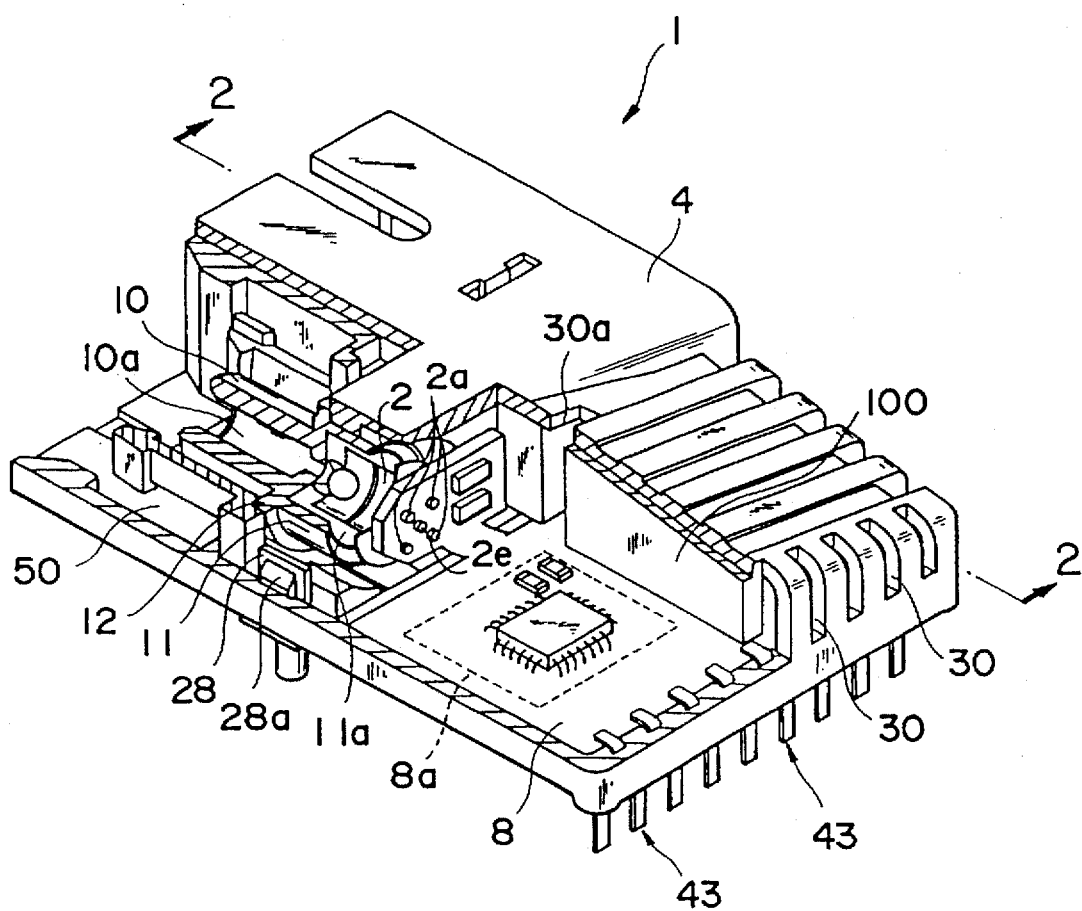
FIG. 1 is a partial sectional view showing an optical module to which a circuit board according to the present invention can be applied.
Figure 2:
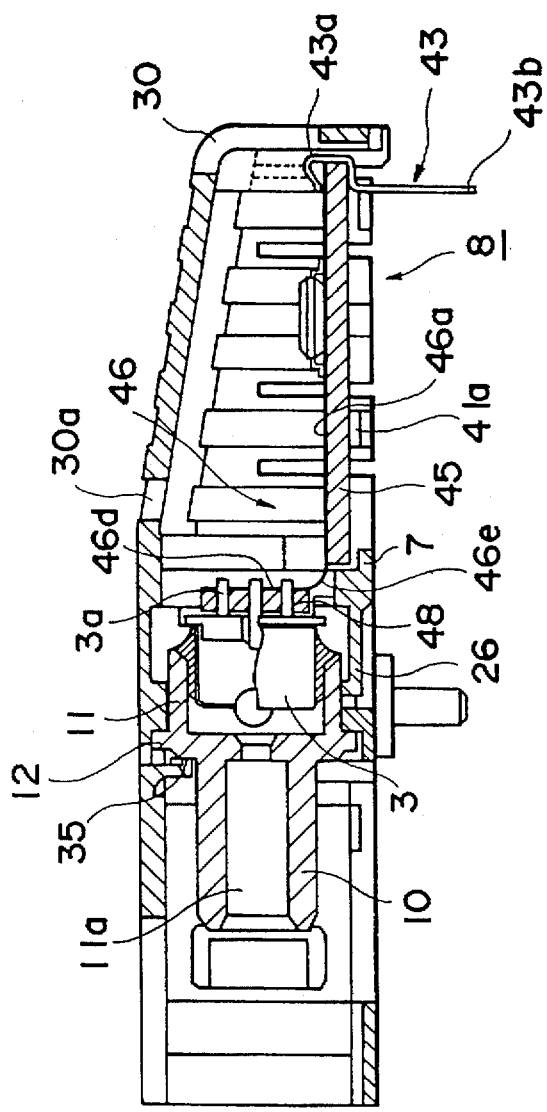
FIG. 2 is a sectional view of the optical module shown in FIG. 1 along the line A—A.

FIGS. 1 and 2 show a transceiver optical module to which a circuit board 8 of the present invention is applicable. This optical module 1 integrally incorporates a transmission optical operation element (e.g., a semiconductor laser) 3 and a reception optical operation element (e.g., a photodiode) 2. The optical module 1 has a housing 4 consisting of PPS (polyphenylene sulfide) and having a U-shaped section. The housing 4 incorporates resin sleeves 5 and 6 which accommodate the optical operation elements 2 and 3, a resin sleeve holder 7 for fixing the sleeves 5 and 6 at predetermined positions in the housing 4, and a circuit board 8 which is electrically connected to a plurality of terminals 2a and 3a extending from the optical operation elements 2 and 3, and has a flexible printed circuit 46 fixed on the surface thereof.

A flange 12 for fixing the sleeve 5 (6) itself in the housing 4 is formed on the outer circumferential surface of the sleeve 5. A ferrule holding portion 10 having a ferrule insertion port 10a which receives an optical fiber positioning ferrule arranged at the distal end of a connector plug, and an element holding portion 11 having an element insertion port 11a which receives the optical operation element 2 (3) and is fixed with an adhesive (e.g., an ultraviolet-curing resin) are provided on both the sides of the flange 12, respectively.

The sleeve 5 (6) is fixed by being urged against a support portion 31 (32) projecting from the inner wall of the housing 4 by a spring piece 35 arranged on the inner wall of the housing 4, a spring piece 26 (27) arranged on the sleeve holder 7, and the like The circuit board 8 of the present invention is mounted in the opening portion of the housing 4, while a first surface 8a on which electronic components are mounted opposes The inner wall of the housing 4. More specifically, as shown in FIG. 2, a base plate 45 fixed to the second surface of a main body portion 46a of the flexible printed circuit 46 is mounted in the opening portion of the housing 4 to accommodate a neck portion 46e (46c) and a head portion 46d (46b) having an auxiliary plate 48 (47) fixed on the head portion 40d(40b) to the cavity of the housing 4.

The main body portion 46a of the flexible printed circuit 46 is supported by a member 100. A plurality of openings 30 and 30a are formed in the side walls and the like of the housing 4 which cover the main body portion 46a so as to efficiently drain the cleaning solution from the cavity of the housing 4 in cleaning the optical module 1.

Figure 3:
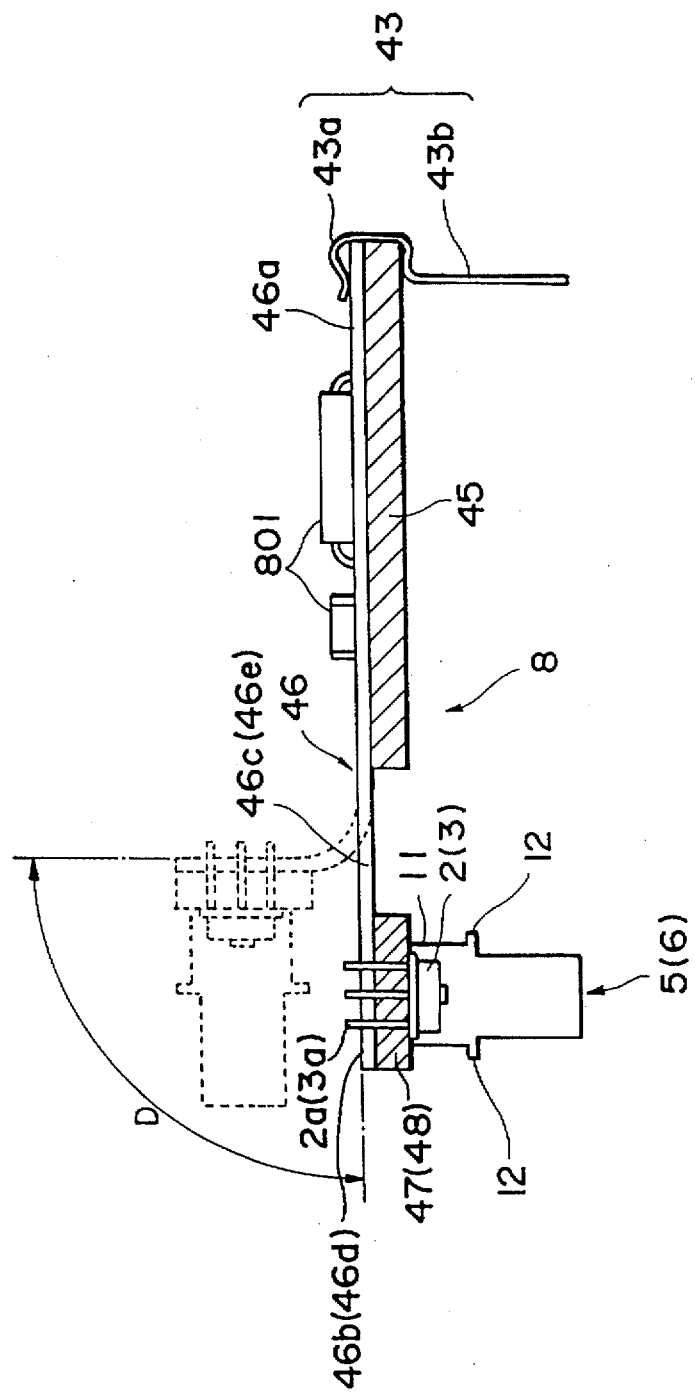
FIG. 3 is a view showing the structure of an optical module circuit board according to the present invention.

The structure of the circuit board 8 will be described with reference to FIGS. 3 and 4. As shown in FIG. 3, the circuit board 8 has the flexible printed circuit (FPC) 46. The FPC 46 comprises the main body portion 46a on which circuit elements 801 are mounted, the head portion 46b (46d) connected, by soldering or the like, to the terminals 2a (3a) of the optical operation element 2 (3) adhered and fixed to the sleeve 5 (6), and the neck portion 46c (46e) coupling the main body portion 46a to the head portion 46b (46d) The head portion 46b (46d) has the reinforcing plate 47 (48) as a backing plate; and the main body portion 46a has the base plate 45 as a backing plate to obtain a desired strength. The circuit board 8 is bent at the neck portion 46c (46e) in a direction indicated by an arrow D. When the circuit board 8 is attached at the opening portion of the housing 4, each sleeve 5 (6) is accommodated to the cavity of the housing 4. Each lead pin 43 has a lock portion 43a so as to mount the circuit board 8 from the second side. This lock portion 43a is continuous to a straight extraction portion 43b.

Figure 4:
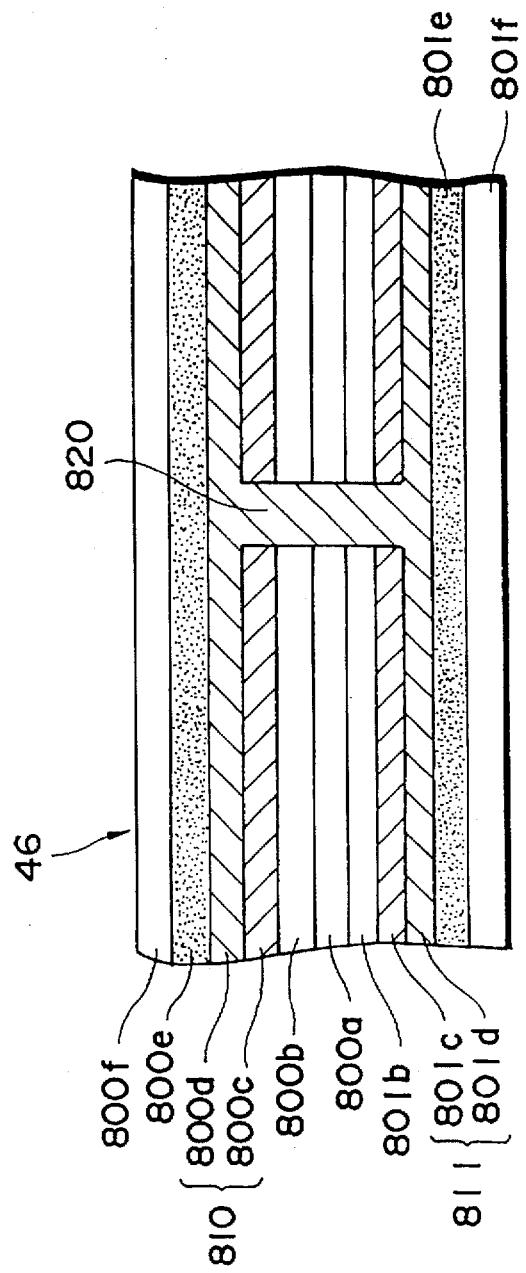
FIG. 4 is a sectional view showing the internal structure of the circuit board in FIG. 3.

The sectional structure of the FPC 46 is a multilayered structure in which a plurality of metal interconnections (e.g., a signal line for transmitting an electrical signal and a ground line) are formed in different layers through an insulating layer, as shown in FIG. 4. More specifically, the FPC 46 is constituted as follows. The epoxy layer 800b (20 μm) as an adhesive layer for adhering layers, a copper layer 810 (18 μm) as a metal wiring layer, the epoxy layer 800e (20 μm) as an adhesive layer for adhering layers, and a polyimide layer 800f (25 μm) as a cover layer for the FPC are sequentially formed on one surface of the polyimide layer 800a (25 μm) as a base. At the same time, an epoxy layer 801b (20 μm) as an adhesive layer for adhering layers, a metal wiring layer 811 (18 μm), an epoxy layer 801e (20 μm) as an adhesive layer for adhering layers, and a polyimide layer 801f (25 μm) as a cover layer for the FPC are sequentially formed on the other surface of the polyimide layer 800a (25 μm) as the base in this manner, multilayered structures vertically symmetrical about the base 800a are realized.

Note that the metal wiring layer 810 (811) is constituted by stacking, on the metal wiring layer 810 (811), the first copper layer 800c (801c) as a conductive layer, and the second copper layer 800d (801d) as a conductive layer for a through hole 820 as shown in FIG. 4.

Figure 5:
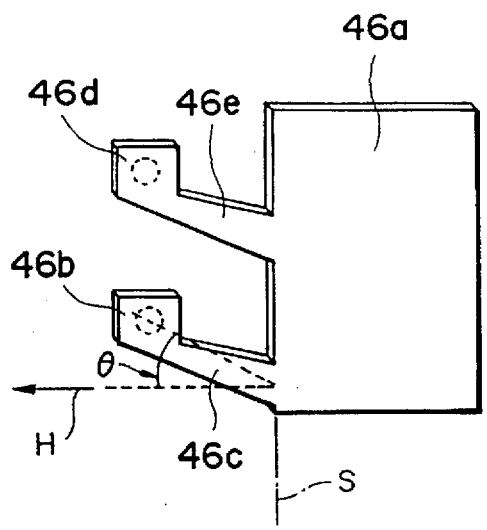
FIGS. 5 and 6 are views each showing the schematic shape of the optical module circuit board according to the present invention.

As shown in FIG. 5, the FPC 46 comprises the rectangular main body portion 46a fixed to the base plate 45, the head portion 46b (46d) electrically connected directly to the terminal 2a of the optical operation element 2, and the neck portion 46c (46e) extending from the main body portion 46a to electrically connect the main body portion 46a to the head portion 46b (46d).

The head portion 46b is formed at a position having a predetermined angle θ with respect to a perpendicular (a dashed line in FIG. 5; this dashed line coincides with the direction of the neck portion 46c extending from the main body portion 46a) which is drawn from a coupling position between the neck portion 46c and the main body portion 46a with respect to the coupling surface (a chain line S in FIG. 5) of the neck portion 46c. The head portion 46b has the degree of three-dimensional freedom. With this arrangement, a structure having a high resistance to stress in a direction to twist the neck portion 46c can be realized. In addition, the degree of bending freedom can be greatly increased, thereby preventing the neck portion 46c from cutting. The neck portion 46c has no member for supporting the second surface of the neck portion 46c. Therefore, the head portion 46b can be easily raised from the main body portion 46a, and the positional relationship between the circuit board 8 and the optical operation element 2 can be freely set.

Figure 6:
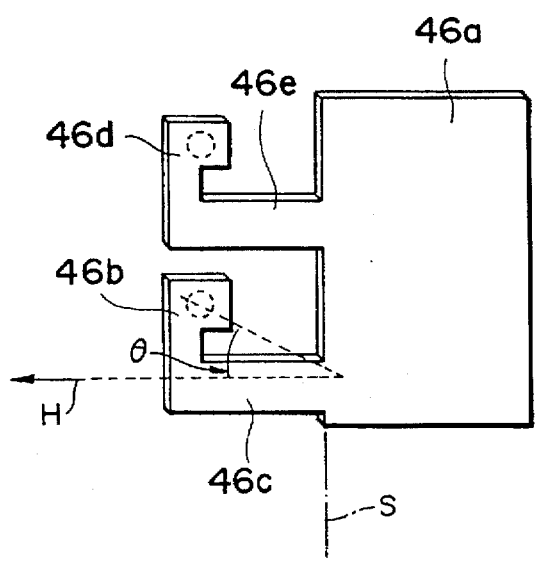
Figure 8:
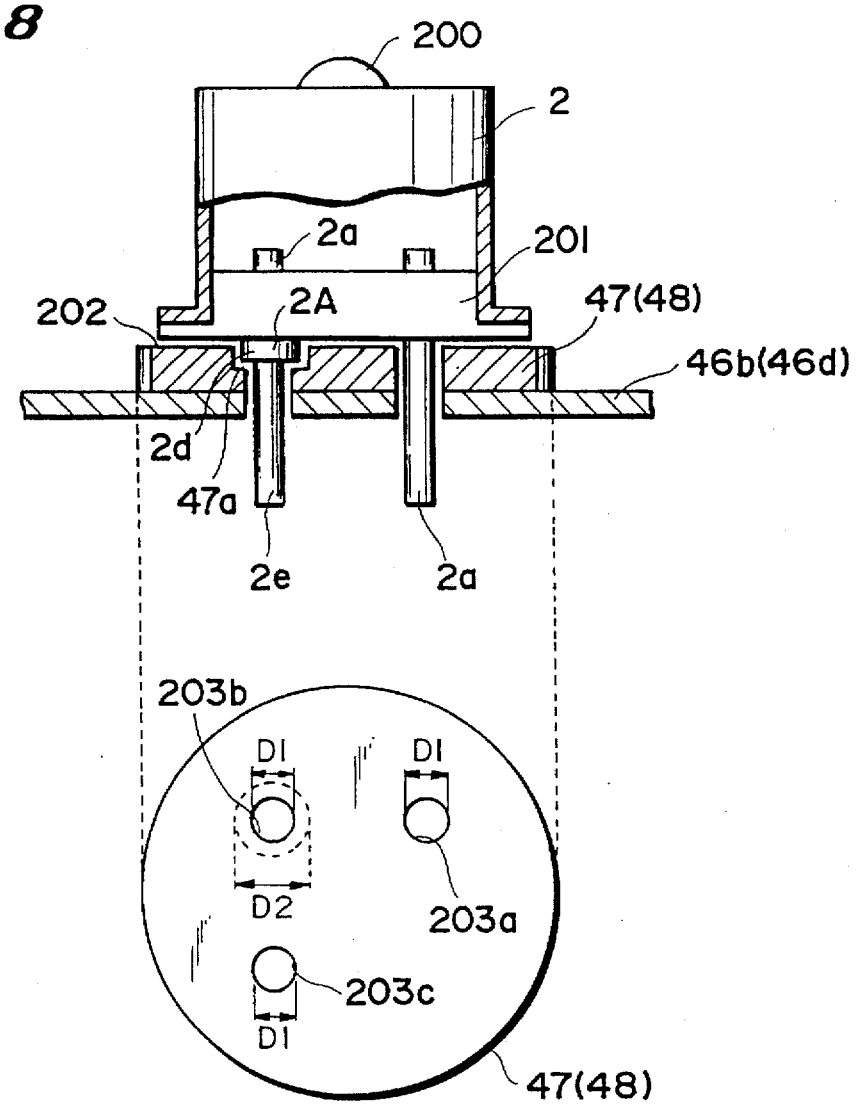
FIG. 8 shows a sectional view and a plan view each showing the structure of an auxiliary plate fixed to the head portion.

Note that the flexible printed circuit 46 may have a structure shown in FIG. 8 That is, the neck portion 46c may extend perpendicularly to the main body portion 46a. By bending this neck portion 46c at almost a right angle, the head portion 46b can be formed at the position having the angle θ with respect to a perpendicular (a dashed line in FIG. 6) which is drawn from the coupling position between the neck portion 46c and the main body portion 46a with respect to the coupling surface of the neck portion 46c. A structure having a high resistance to stress in the direction to twist the neck portion 46c can be realized. Furthermore, the neck portion 46c may be formed into a spiral shape and given with spring properties. With this arrangement, the same effect as described above can be obtained.

The characteristic feature common to the above examples is that the barycenter in a region of the head portion 46b (46d) for mounting the optical operation element 2 (3) is offset in a direction perpendicular to a direction H of the neck portion 46c (46e) extending from the main body portion 46a and a direction D to bend the neck portion 46c (46e) (FIG. 3).

A way of obtaining the barycenter in the region for mounting the optical operation element 2 (3) will be explained with reference to FIG. 7.

Figure 7:
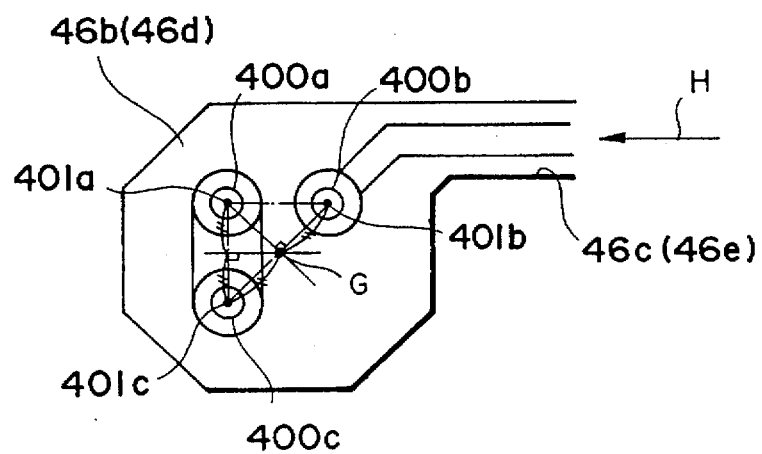
FIG. 7 is a view for explaining the barycenter in the optical operation element mounting region of a head portion on which an optical operation element is mounted.

For example, a polygon (triangle in this embodiment) is drawn using, as vertices, centers 401a, 401b, and 401c of three through holes 400a, 400b, and 400c (which receive the terminals 2a (3a) extending from the bottom portion of the optical operation element 2 (3)) in the head portion 46b (46d), as shown in FIG. 7. A barycenter G obtained from this polygon is defined as the barycenter in the element mounting region.

Figure 9:
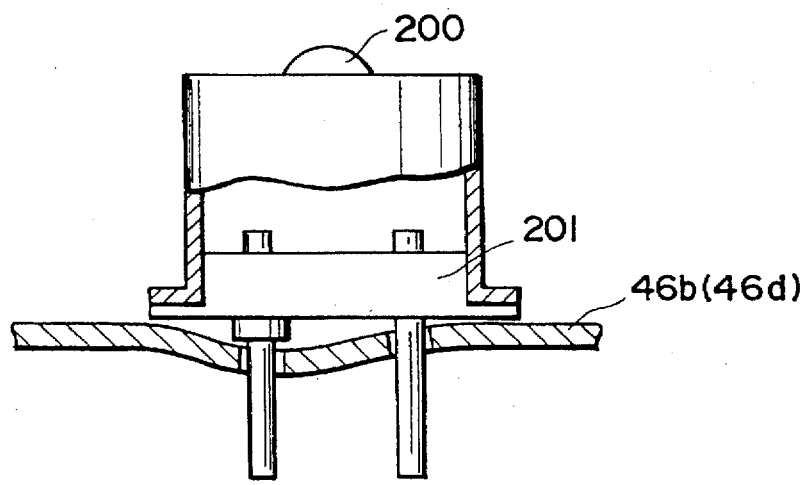
FIG. 9 is a view showing the state of the head portion without any auxiliary plate in FIG. 8.

FIG. 8 is a schematic view showing a state in which the optical operation element 2 (3) is mounted on the head portion 46b (46d) of the FPC 46. The auxiliary plate 47 (48) having a predetermined thickness and a proper bending strength is fixed to the head portion 46b (46d). A recess 47a is formed in a mounting surface 202 of the auxiliary plate 47. The recess 47a stores a projection 2d formed of a solder in joining a ground terminal 2e of the optical operation element 2 (3) to a bottom surface 2A of the optical operation element 2 by soldering. No excess load is applied to the head portion 46b of the FPC 46 in surface-mounting the optical operation element 2 (3) on the FPC 46 because this recess 47a stores the projection 2d, unlike a state shown in FIG. 9.

A diameter D2 of the recess 47a is larger than a diameter D1 of each of through holes 203a, 203b, and 203c which receive the terminals 2a and 2e.

As has been described above, according to the present invention, the main body portion of the optical module circuit board is coupled to the head portion through the neck portion. With this structure, the flexible neck portion can absorb a stress in the twist direction to prevent cutting and disconnection between the main body portion and the neck portion and between the neck portion and the head portion.

The reinforcing plate having the recess for storing the projection formed on the bottom surface of the optical operation element is fixed to the optical operation element mounting surface of the flexible head portion. With this structure, when the optical operation element is mounted, the projection formed on the bottom surface of the optical operation element can be stored in the recess of the reinforcing plate. No excess load is applied to the flexible head portion in mounting (see FIG. 9).

Figure 10:
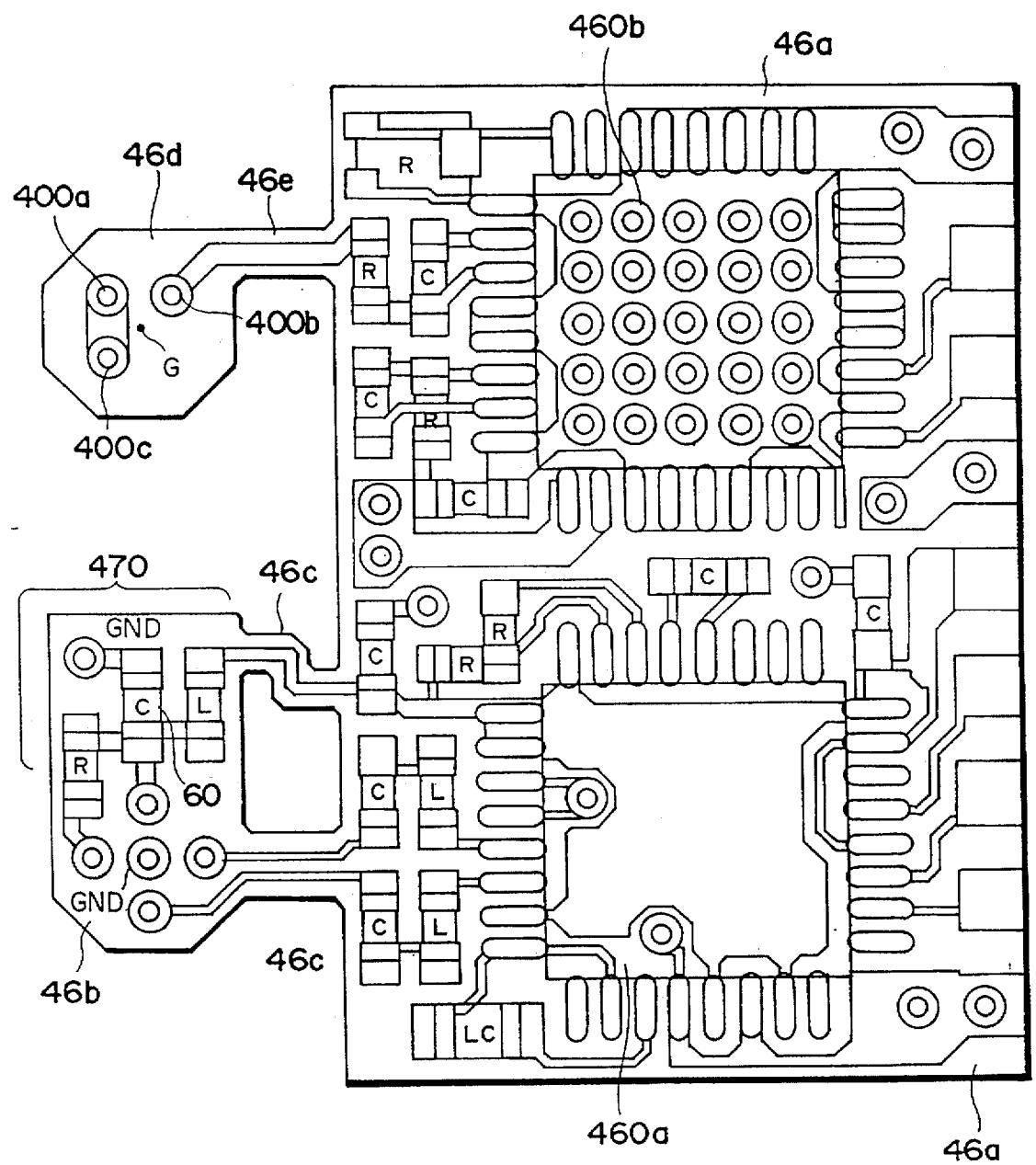
FIG. 10 is a view showing an example of the wiring pattern of the optical module circuit board according to the present invention.

FIG. 10 shows a pattern on the FPC 46. As shown in FIG. 10, a power supply filter circuit 470 including a bypass capacitor 60 is mounted on the head portion 46b. The optical operation element 2 is mounted on a surface opposite to this pattern mounting surface. Therefore, the optical operation element 2 can be set near the bypass capacitor 60.

Note that LSI chips 801 are mounted on regions 460a and 460b defined on the main body portion 46a, as shown in FIG. 10.

Figure 11:
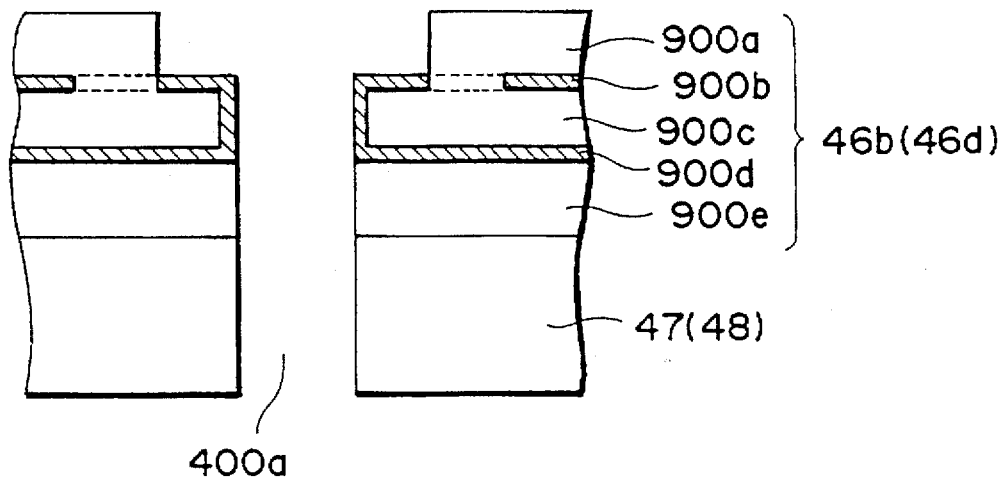
FIGS. 11 and 12 are sectional views showing a connection structure between a terminal extending from the bottom portion of the optical operation element and a ground line of the flexible printed circuit.
Figure 12:
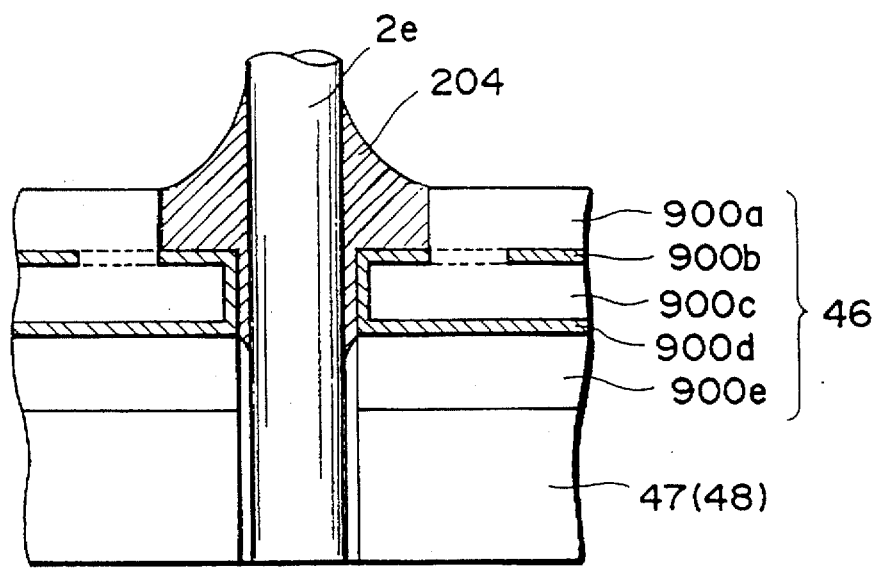

FIGS. 11 and 12 are sectional views showing a structure for connecting a ground pattern on the head portion 46b (46d) to the ground terminal 2e of the optical operation element 2 (3). These figures show the modified structure of FIG. 4. Therefore the layer 900a includes the layers 800e and 800f of FIG. 4, the layer 900b includes the layers 800c and 800d of FIG. 4, the layer 900c includes the layers 800a, 800b and 801b of FIG. 4, the layer 900d includes the layers 801c and 801d of FIG. 4, and the layer 900e includes the layers 801e and 801f of the FIG. 4.

As shown in FIG. 11, a ground pattern in the FPC 46 electrically contacts the ground wiring layer 900d in the through hole 400a.

The ground terminal 2e of the optical operation element 2 inserted in the through hole 400a is electrically connected to the ground pattern through a solder 204.

Since the optical operation element and the power supply filter circuit are mounted close to each other on the head portion 46b (46d), a sufficient bypass effect can be obtained. The head portion 46b (46d), therefore, can be connected and fixed to another printed wiring board 460.

Figure 13:
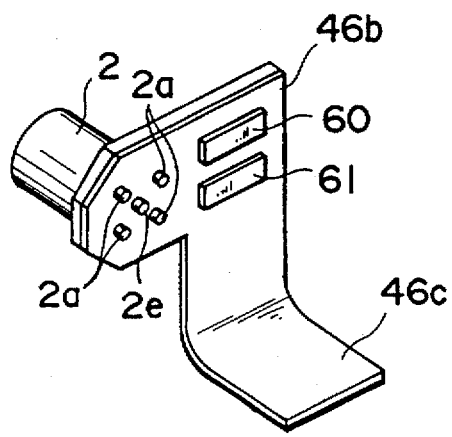
FIG. 13 is a view showing an application of the optical module circuit board according to the present invention.
Figure 14:
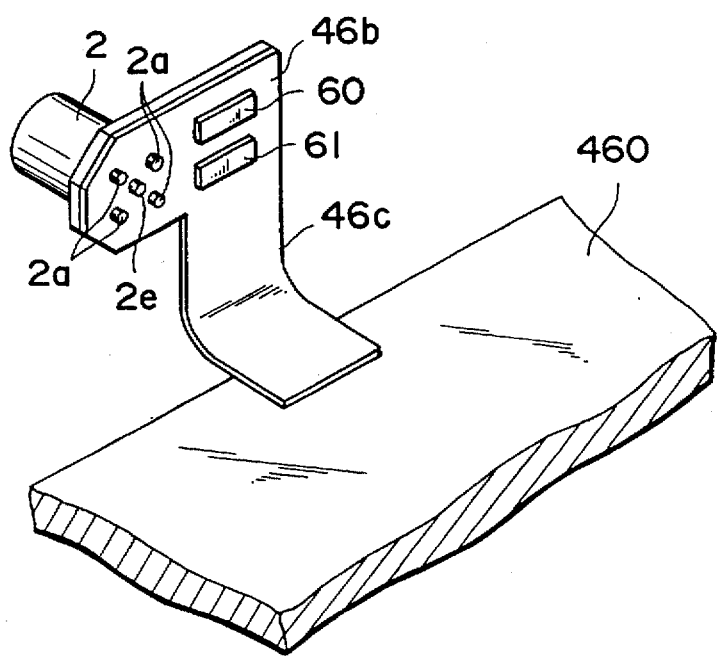
FIG. 14 is a view showing a state in which the optical module circuit board in FIG. 13 is fixed to a printed wiring board.

As shown in FIG. 13, the head portion 46b and the neck portion 46c of the FPC 46 are separated from the main body portion 46a. The power supply filter circuit such as the bypass capacitor 60 and a peripheral circuit 61 are mounted on the head portion 46b near a position at which the optical operation element 2 is mounted. The optical module is constituted by the head portion 46b the neck portion 46c, the bypass capacitor 60, and the peripheral circuit 61 in this case, as shown in FIG. 14, the end portion of the neck portion 46c is electrically coupled to the main body portion 46a by soldering, welding, thermal compression, or the like.

With this arrangement, a sufficient bypass effect can be obtained because a distance between the optical operation element 2 and the bypass capacitor 60 can be greatly shortened. In addition, the versatility of the board itself can be improved by employing the board structure which integrally incorporates the head portion 46b, the neck portion 46c, the bypass capacitor 60, and the peripheral circuit 61.

Figure 15:
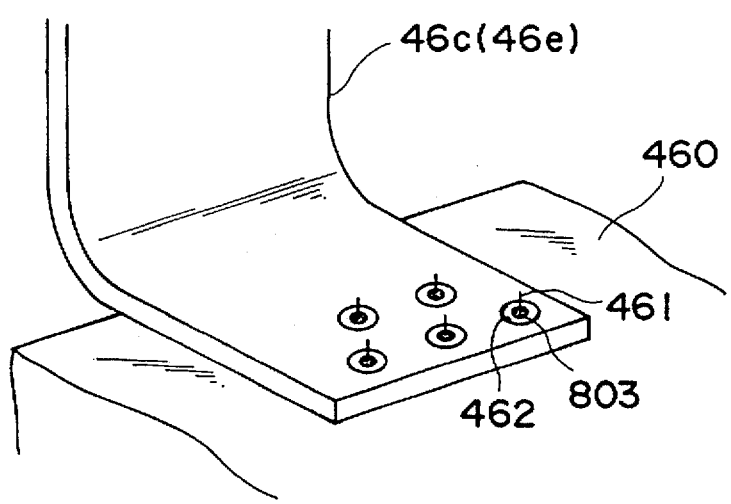
FIGS. 15 to 17 are views for explaining a method of fixing the optical module circuit board in FIG. 13 to the printed wiring board.
Figure 16:
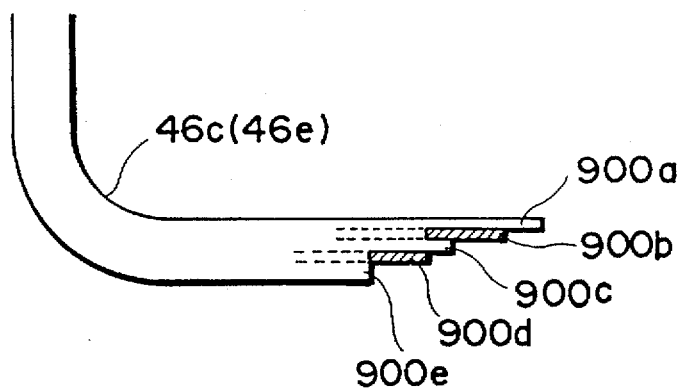
Figure 17:
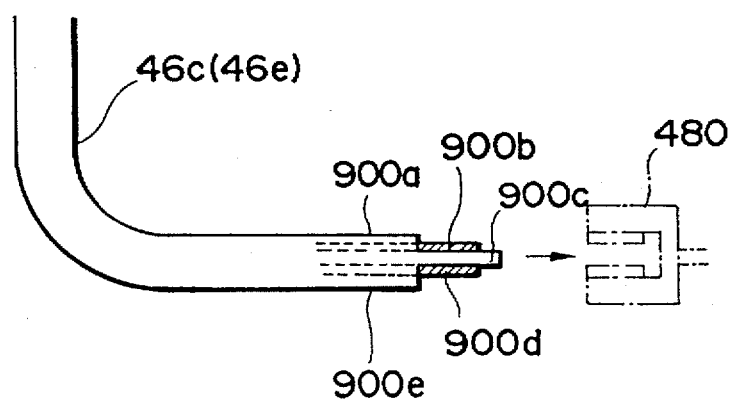

Note that the neck portion 46c may be connected to the board 460 by connecting a wiring pattern 803 formed on the first surface of the neck portion 46c to a connection pin 461 arranged on the board 460 through a solder 462, as shown in FIG. 15. Further as shown in FIG. 16, the end portion of the neck portion 46c may be exposed by stripping the polyimide layer and the like. Moreover, as shown in FIG. 17 the end portion of the neck portion 46c may be shaped to be inserted in a socket 480 arranged on the printed wiring board 460.

Figure 18:
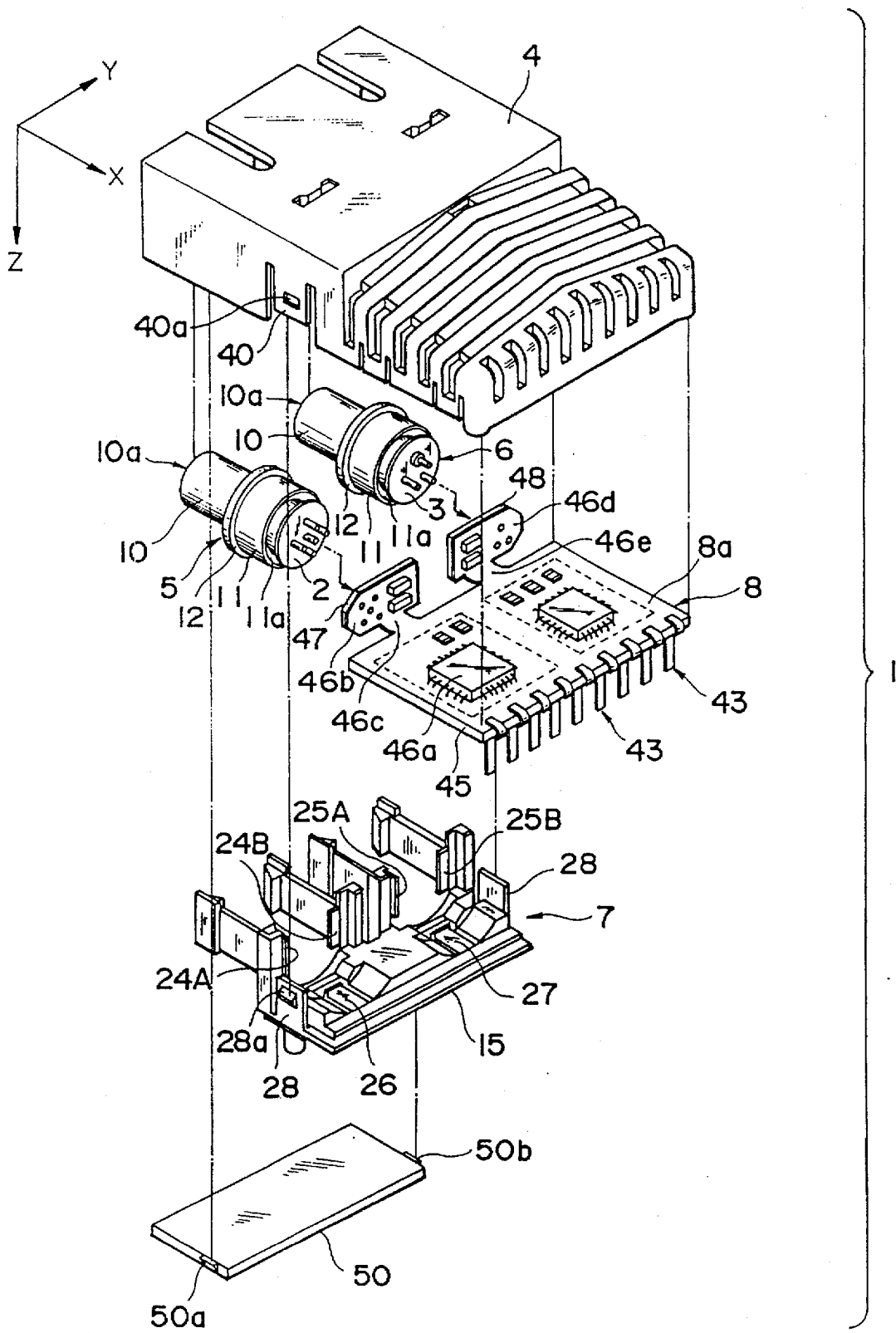
FIGS. 18 to 20 are perspective views for explaining the assembly process of the optical module to which the circuit board of the present invention is applied.

The assembly process of the optical module 1 to which the circuit board 8 is applied will be described with reference to FIGS. 18 to 20. FIG. 18 is a perspective view showing the optical module 1 when viewed from the housing 4 side. The sleeves 5 and 6 to which the optical operation elements 2 and 3 are adhered and fixed by the element holding portions are held by electrically connecting and fixing the optical operation elements 2 and 3 to part of the circuit board 8. When the circuit board 8 is mounted in the housing 4, the sleeves 5 and 6 are accommodated to the housing 4.

First latch portions 28 extending from a base portion 15 of the sleeve holder 7 are engaged with second latch portions 40 formed on the side walls of the housing 4 to attach the sleeve holder 7 so the housing 4. More specifically, projections 28a of the first latch portions 28 are fitted in openings 40a of the second latch portions 40 to attach the sleeve holder 7 at the opening portion of the housing 4.

Figure 19:
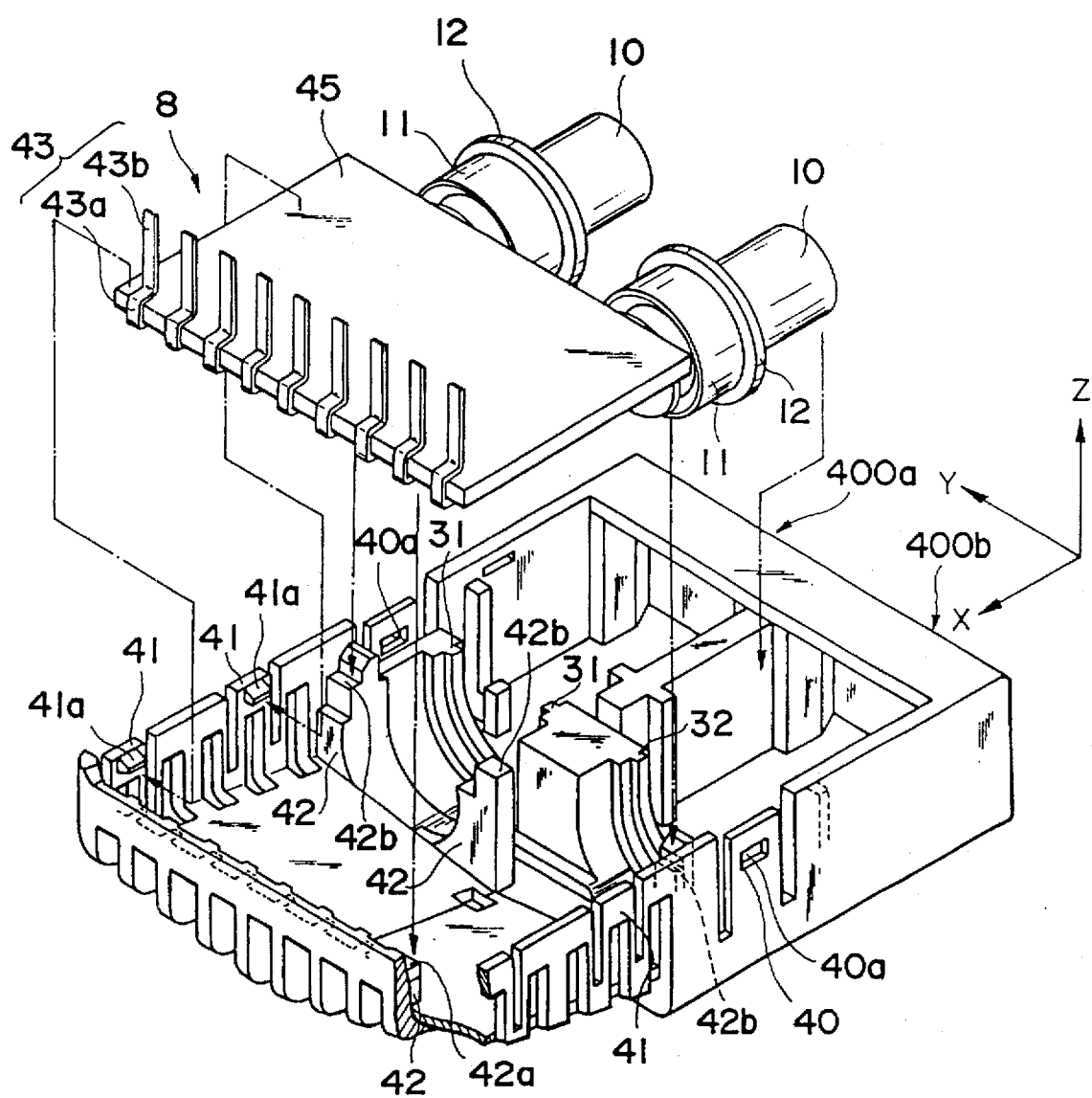

At this time, the sleeves 5 and 6 already accommodated to the housing 4 are automatically set at predetermined positions in accordance with a special structure shown in FIGS. 2, 18, and 19.

A protective plate 50 covers the opening portion of the housing 4 to hide the optical sleeves 5 and 6 in the housing 4. More specifically, projections 50a and 50b are formed at both the ends of the plate 50. When the projections 50a and 50b are fitted in grooves 50c and 50d formed in the inner walls of the housing 4, the plate 50 is automatically attached at the opening portion of the housing 4.

Referring to FIG. 10, spring pieces 24A and 24B (25A and 25B) and the spring piece 26 (27) arranged on the sleeve holder 7 urge the flange 12 of the sleeve 5 (6) against the support portion 31 (32) in the housing 4 to fix the sleeve 5 (6) at the predetermined position in the cavity of the housing 4.

The assembly process of the optical module 1 will be described with reference to FIGS. 19 and 20 viewed from a direction opposite to FIG. 18.

FIG. 19 shows a structure in which the circuit board 8 having each sleeve 5 (6) thereon and the neck portions 46c and 46e bent in a predetermined shape is attached at the opening portion of the housing 4.

A plurality of board support portions 42 are formed inside the housing 4, and a first surface 8a (i.e., a surface on which the circuit elements 801 are mounted) of the circuit board 8 abuts against surfaces 42a and 42b of the board support portions 42. A plurality of hook pieces 41 are formed on the inner walls of the housing 4, and the edge portion of the circuit board 8 is clamped between lock portions 41a of the hook pieces 41 and the board support portions 42 to attach the circuit board 8 at the opening portion of the housing 4. At this time, the openings (openings of the insertion holes) of the ferrule holding portions 10 of the sleeves 5 and 6 accommodated to the cavity of the housing 4 respectively face the openings 400a and 400b (openings for externally inserting ferrules 9a into the housing 4) formed in the front surface of the housing 4.

Figure 20:
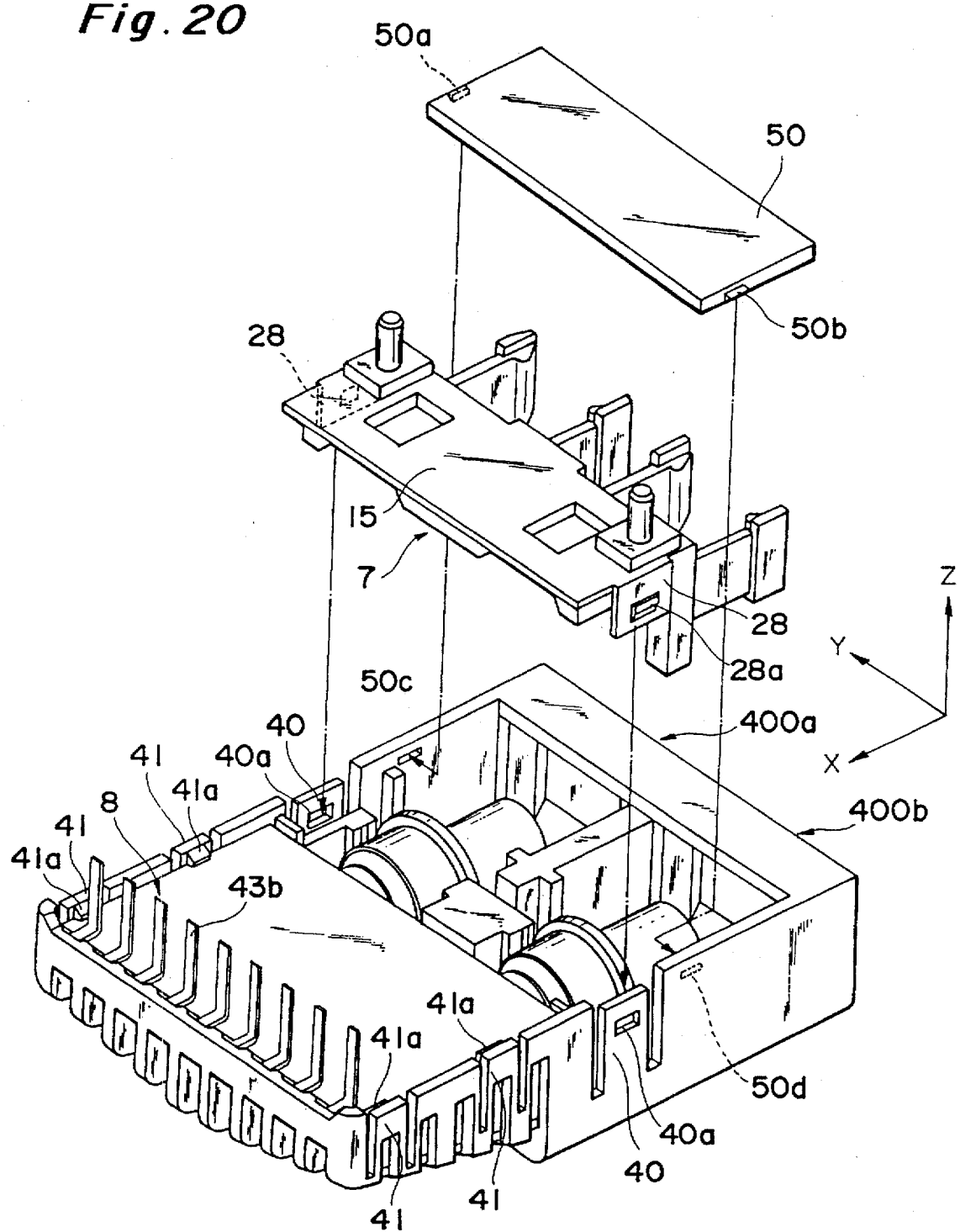

After the circuit board 8 is attached to the housing 4 while the entire sleeves 5 and 6 are disposed in the housing 4, the sleeve holder 7 and the protective plate 50 are sequentially attached at the opening portion of the housing 4, as shown in FIG. 20.

More specifically, the first latch portions 2B are formed at both the sides of the base portion 15 of the sleeve holder 7, and the second latch portions 40 engaged with the first latch portions 28 are formed on the side walls of the housing 4.

when the projections 28a of the first latch portions 28 are fitted in the openings 40a of the second latch portions 40, the sleeve holder 7 is automatically detached at the opening portion of the housing 4. At this time, the sleeves 5 and 6 are automatically fixed at the predetermined positions in the housing 4.

The projections 50a and 50b are formed at both the ends of the protective plate 50, and the grooves 50c and 50d corresponding to the projections 50a and 50b are formed in the inner walls of the housing 4. When the projections 50a and 50b of the protective plate 50 are fitted in the grooves 50c and 50d, the protective plate 50 is automatically attached at the opening portion of the housing 4. As a result, the second opening (i.e.: the opening for receiving each sleeve 5 (6)) of the housing 4 is covered with the circuit board 8, the base portion 15 of the sleeve holder 7, and the protective plate 50.

Figure 21:
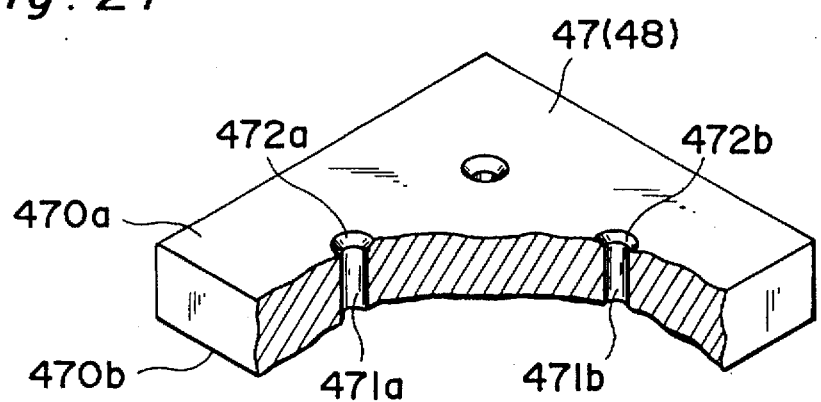
FIG. 21 is a partial sectional view showing a first embodiment of an auxiliary plate for reinforcing the head portion of the flexible printed circuit according to the present invention.
Figure 22:
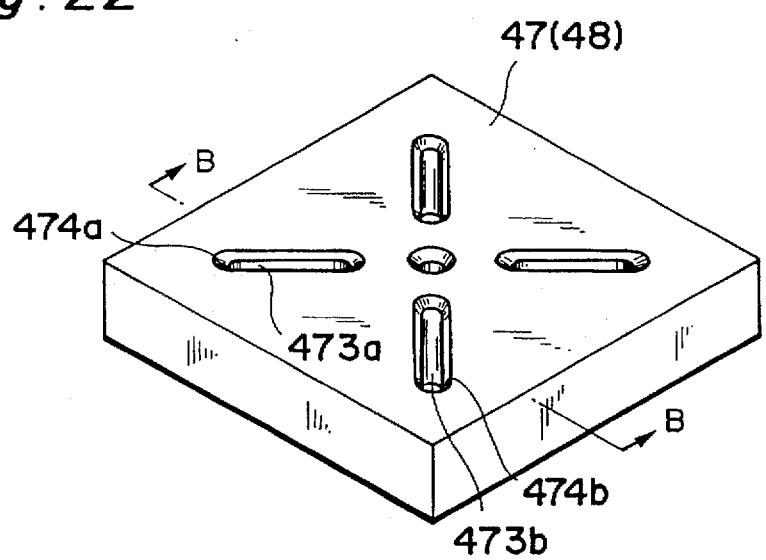
FIG. 22 is a partial sectional view showing a second embodiment of an auxiliary plate for reinforcing the head portion of the flexible printed circuit according to the present invention.
Figure 23:
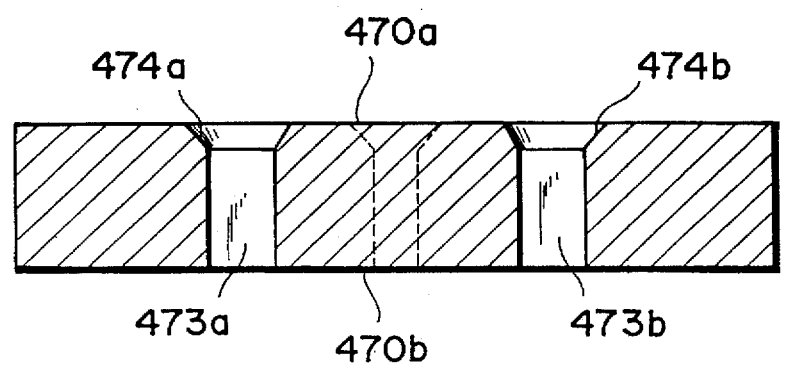
FIG. 23 is a sectional view of the auxiliary plate shown in FIG. 22 along the line B—B.

It is preferable the auxiliary plate 47 (48) has a structure shown in FIGS. 21 and 22 in particular. FIG. 23 is a sectional view showing the auxiliary plate 47 (48) shown in FIG. 22 along the line B—B.

A first embodiment of the auxiliary plate 47 (48), as shown in FIG. 21; has a first surface 470b being in contact with the second surface of the FPC 46, a second surface 470a opposite to the first surface 470b, and a plurality of through holes 471a and 471b extending from the second surface 470a to the first surface 470b. The plurality of through holes 471a and 471b respectively have tapered openings 472a and 472b. By this structure, each of the terminals 2a and 2e (see FIGS. 1, 13 and 14) of the optical operation element 2 (3) may be easily inserted into the corresponded through hole.

A second embodiment of an auxiliary plate 47 (48), as shown in FIGS. 22 and 23, also has a plurality of slotted holes 473a and 473b extending from the second surface 470a to the first surface 470b. And the slotted holes 473a and 473b, as shown in FIG. 23, respectively have tapered openings 474a and 474b. Even if the intervals between the ground terminal 2e and the other terminals 2a surrounding the terminal 2e are varied, each of the terminals 2a can be inserted the corresponded slotted holes. By the structure, the varied types of optical elements can be inserted one kind of the auxiliary plate 47 (48) shown in FIGS. 22 and 23. Furthermore, it is preferable the slotted holes 473a and 473b respectively have tapered openings 474a and 474b.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Applications No. 269870/1994 filed on Nov. 2, 1994 and No. 275099/1994 filed on Nov. 9, 1994 are hereby incorporated by reference.

What is claimed is:

1. An optical module circuit board comprising a flexible printed circuit having at least a multilayered structure in which a layer containing a conductive metal interconnection is sandwiched between insulating layers, wherein said flexible printed circuit includes:

a main body portion having said multilayered structure, a first surface mounted which an electronic component, and a second surface opposite to said first surface;

a neck portion having said multilayered structure, extending from one end of said main body portion, and having a first surface continuously extending from said first surface of said main body portion, and a second surface continuously extending from said second surface of said main body portion; and a head portion positioned at a distal end of said neck portion extending from said one end of said main body portion, having said multilayered structure, and mounted with an optical operation element, said head portion having a first surface continuously extending from said first surface of said neck portion, and a second surface continuously extending from said second surface of said neck portion, said neck portion holds said head portion so as to set said first surface of said head portion on a plane different from a plane including said first surface of said main body portion, and a barycenter in a region of said head portion for mounting an optical operation element is offset in a direction perpendicular to a direction of said neck portion extending from said main body portion and a direction to bend the neck portion.

2. A circuit board according to claim 1, further comprising an auxiliary plate having a first surface being in contact with and entirely covering said second surface of said head portion, and a second surface opposite to said first surface of said auxiliary plate and facing said optical operation element, said auxiliary plate having a recess with a predetermined diameter, which is larger than that of a through hole extending from said second surface of said auxiliary plate to said first surface of said head portion, at an opening portion of the through hole which receives a terminal of said optical operation element.

3. A circuit board according to claim 2, further comprising a base plate having a first surface being in contact with said second surface of said main body portion to cover said entire second surface of said main body portion, and a second surface opposite to said first surface of said base plate.

4. A circuit board according to claim 1, wherein said head portion has a power supply filter circuit with a bypass capacitor mounted on said first surface of said head portion.

5. An optical module circuit board comprising a flexible printed circuit having at least a multilayered structure in which a layer containing a conductive metal interconnection is sandwiched between insulating layers, wherein said flexible printed circuit includes:

a main body portion having said multilayered structure, a first surface mounted with an electronic component, and a second surface which opposes said first surface and is in contact with and entirely covered with a first auxiliary plate;

a neck portion having said multilayered structure, extending from one end of said main body portion, and having a first surface continuously extending from said first surface of said main body portion, and a second surface continuously extending from said second surface of said main body portion; and a head portion positioned at a distal end of said neck portion extending from said one end of said main body portion having said multilayered structure, and mounted with an optical operation element, said head portion having a first surface continuously extending from said first surface of said neck portion, and a second surface which continuously extends from said second surface of said neck portion, and is in contact with and entirely covered with a second auxiliary plate, said second auxiliary plate physically spaced apart from said first auxiliary plate, said neck portion holds said head portion so as to set said first surface of said head portion on a plane different from a plane coplanar with said first surface of said main body portion, and said second surface of said neck portion is exposed between said first auxiliary plate and said second auxiliary plate.

6. A circuit board according to claim 5, wherein said auxiliary plate comprises a first surface being in contact with and entirely covering said second surface of said head portion, a second surface opposite to said first surface of said second auxiliary plate and facing an optical operation element, and a recess with a predetermined diameter, which is larger than that of a through hole extending from said second surface of said second auxiliary plate to said first surface of said head portion, at an opening portion of the through hole which receives a terminal of said optical operation element.

7. An optical module circuit board comprising a flexible printed circuit having at least a multilayered structure in which a layer containing a conductive metal interconnection is sandwiched between insulating layers, wherein said flexible printed circuit includes:

a head portion having said multilayered structure, a power supply filter circuit with a bypass capacitor mounted on a first surface, and an optical operation element mounted on a second surface opposite to said first surface; and a terminal portion having said multilayered structure, extending from one end of said head portion, and having a first surface continuously extending from said first surface of said head portion, and a second surface continuously extending from said second surface of said head portion.

8. A circuit board according to claim 7, further comprising an auxiliary plate having a first surface being in contact with and entirely covering said second surface of said head portion, and a second surface opposite to said first surface of said auxiliary plate and facing said optical operation element, and wherein said second surface of said terminal portion is exposed without being brought into contact with said auxiliary plate.

9. A circuit board according to claim 8, wherein said auxiliary plate comprises a recess with a predetermined diameter, which is larger than that of a through hole extending from said second surface of said auxiliary plate to said first surface of said head portion, at an opening portion of the through hole to which a terminal of said optical operation element is inserted.

10. A circuit board according to claim 8; wherein said auxiliary plate has a plurality of through holes extending from said second surface of said auxiliary plate to said first surface of said auxiliary plate, each having a tapered opening at said second surface side of said auxiliary plate.

11. A circuit board according to claim 8, wherein said auxiliary plate has a plurality of slotted holes extending from said second surface of said auxiliary plate to said first surface of said auxiliary plate.

12. A circuit board according to claim 11, wherein each of said slotted holes has a tapered opening at said second surface side of said auxiliary plate.

13. A circuit board according to claim 7, wherein a barycenter in a region of said head portion for mounting an optical operation element is offset in a direction perpendicular to a direction of said neck portion extending from said head portion.

* * * * *